(12) United States Patent
Uchida

(10) Patent No.: US 8,169,793 B2
(45) Date of Patent: May 1, 2012

(54) ELECTRONIC DEVICE AND FABRICATION METHOD THEREOF

(75) Inventor: Kenji Uchida, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/911,574

(22) Filed: Oct. 25, 2010

(65) Prior Publication Data

US 2011/0096515 A1   Apr. 28, 2011

(30) Foreign Application Priority Data

Oct. 26, 2009   (JP) ................. 2009-245655

(51) Int. Cl.
*H05K 7/02* (2006.01)
*H05K 7/04* (2006.01)

(52) U.S. Cl. ........ 361/807; 257/701; 257/684; 257/687; 257/678

(58) Field of Classification Search .................. 361/807; 257/701, 684, 687, 678
See application file for complete search history.

(56) References Cited

U.S. PATENT DOCUMENTS

| | | | | |
|---|---|---|---|---|
| 7,276,393 B2 * | 10/2007 | Derderian et al. | ............... | 438/51 |
| 7,397,023 B2 * | 7/2008 | Tsukamoto et al. | .......... | 250/239 |
| 7,977,138 B1 * | 7/2011 | Meng et al. | ...................... | 438/55 |

FOREIGN PATENT DOCUMENTS

JP   2003-068939 A   3/2003

* cited by examiner

*Primary Examiner* — Yuriy Semenenko
*Assistant Examiner* — Andargie M Aychillhum
(74) *Attorney, Agent, or Firm* — Sughrue Mion, PLLC

(57) ABSTRACT

Provided is an electronic device of high reliability having an exposed functional portion. An electronic device 10 comprises an electronic element 11 having an exposed functional portion 11*a* on a first surface, a frame member 12 having a first penetration hole 12*a*, and a board 13 having a second penetration hole 13*a*. The frame member 12 is provided on the first surface of the electronic element 11 such that the first penetration hole 12*a* faces at least a part of the functional portion 11*a*. The electronic element 11 is mounted on the board 13 such that at least a part of the functional portion 11*a* faces the second penetration hole 13*a*. The frame member 12 does not contact with the board 13.

4 Claims, 9 Drawing Sheets

ELECTRONIC DEVICE AND FABRICATION METHOD THEREOF

REFERENCE TO RELATED APPLICATION

This application is based upon and claims the benefit of the priority of Japanese patent application No. 2009-245655, filed on Oct. 26, 2009, the disclosure of which is incorporated herein in its entirety by reference thereto.

TECHNICAL FIELD

This invention relates to an electronic device having an exposed functional portion and a fabrication method thereof.

BACKGROUND

An electronic device for converting an optical signal from outside into an electric signal, for example, is provided with an electronic element having a light receiving portion as a functional portion. In a case where resin is present on an optical path of the optical signal in such an electronic device, the optical signal is attenuated. Besides that a black resin, which can adapt an electronic device to a lead-free reflow conditions by improving a humidity resistance of the electronic device, cannot be used on an optical path of an optical signal. In addition, as for an electronic device relating to an optical recording technology using a blue light for the optical signal, when an epoxy resin is used on an optical path, the epoxy resin on the optical path is degraded by the blue light and light transmittance of the epoxy resin is decreased. Thus some of such electronic devices are structured such that no resin is provided on an optical path, that is, a light receiving portion is exposed (Patent Document 1, for example). It is expected that an electronic device having an exposed functional portion can be applied to MEMS (Micro Electro-Mechanical Systems), a device in which a moving part of a functional element (electro-acoustic filter, for example) cannot be coated with resin, solid image sensing element for a camera, and the like.

Patent Document 1 discloses a semiconductor device having a protruding portion for preventing contamination of an exposed light receiving element. As to the semiconductor device disclosed in Patent Document 1, a semiconductor bare chip having a light receiving portion is mounted on a circuit board by flip chip attachment, a penetration hole is provided on the circuit board at a position corresponding to the light receiving element, and sealing resin is applied between the semiconductor bare chip and the circuit board. The frame-shaped protruding portion is provided around the penetration hole on the circuit board and the semiconductor bare chip is mounted in contact with the top of the protruding portion.
[Patent Document 1]
Japanese Patent Kokai Publication No. JP-P2003-68939A

SUMMARY

The entire disclosure of Patent Document 1 is incorporated herein by reference thereto. The following analyses are given by the present invention.

According to the semiconductor device of Patent Document 1, the protruding portion is provided between the electronic element and the circuit board, and at the same time, in contact with the electronic element. Thus there may be a risk that the protruding portion exerts local pressure and causes a breakage of the electronic element. Particularly, the pressure exerted to the electronic element may increase when the electronic element is mounted on a board or when the protruding portion expanded during a heat processing.

For preventing the breakage of the electronic element due to the local pressure (or load) by the protruding portion at the flip chip attachment, a pressure control will become necessary. However, when controlling of the local pressure is necessary, it is difficult to mount electronic elements rapidly and therefore, productivity will become worse.

In addition, the semiconductor device according to Patent Document 1 requires high dimensional precision of heights of the protruding portion and the bump. If the dimensional precision is low for these elements, an electric contact between the electronic element and the board cannot be secured or the electronic element may be damaged due to local pressure by the protruding portion. On the other hand, for improving the dimensional precision of the elements, additional equipments for improving the high precision become necessary and it causes decrease of the productivity and increase of the production cost. Thus there is much desired in the art.

According to a first aspect of the present invention, there is provided an electronic device comprising: an electronic element having an exposed functional portion on a first surface; a frame member having a first penetration hole; and a board having a second penetration hole. The frame member is provided on the first surface of the electronic element such that the first penetration hole faces at least a part of the functional portion. The electronic element is mounted on the board such that at least a part of the functional portion faces the second penetration hole. The frame member does not contact with the board.

According to a second aspect of the present invention, there is provided a method for fabricating an electronic device comprising: making a frame member on a first surface of an electronic element having an exposed functional portion on the first surface such that the frame member surrounds at least a part of the functional portion; and mounting the electronic element on a board having a penetration hole such that the penetration hole faces at least a part of the functional portion.

The present invention has at least one effect described below.

According to the present invention, the frame member does not contact with the board. Thus a local pressure exerted to the electronic element by the frame member can be avoided. As a result, the present invention provides a high functional and high reliable electronic device.

According to the present invention, there is no need to fabricate the frame and an electrically conductive member (bump) between the electronic element and the board with high precision. Therefore, it is possible to fabricate such electronic devices without decreasing productivity and increasing production cost.

PREFERRED MODES

Followings are preferred modes of each aspect of the present invention.

According to a preferred mode of a first aspect of the present invention, the frame member is inserted into the second penetration hole of the board.

According to a preferred mode of a first aspect of the present invention, a gap is formed between an outer surface of the frame member and an internal surface of the second penetration hole of the board.

According to a preferred mode of a first aspect of the present invention, the frame member has a height of 0.03 mm or more.

According to a preferred mode of a first aspect of the present invention, the frame member is made of resin.

According to a preferred mode of a second aspect of the present invention, the electronic element is mounted on the board such that the frame member is inserted into the penetration hole in a mounting step.

According to a preferred mode of a second aspect of the present invention, the step for making a frame member comprises: forming a precursor film for a frame member on the electronic element, and processing the precursor film for a frame member such that at least a part of the functional portion is exposed.

Figure 1:
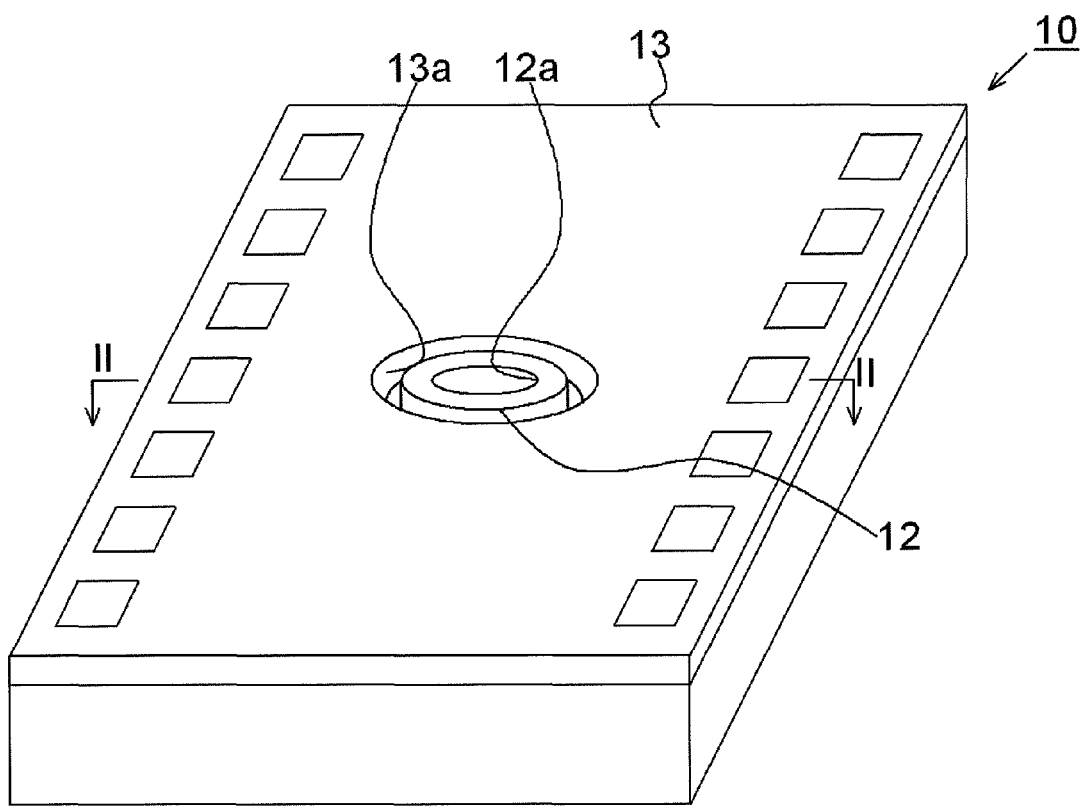
FIG. 1 is a perspective view of an electronic device according to a first exemplary embodiment of the present invention.
Figure 2:
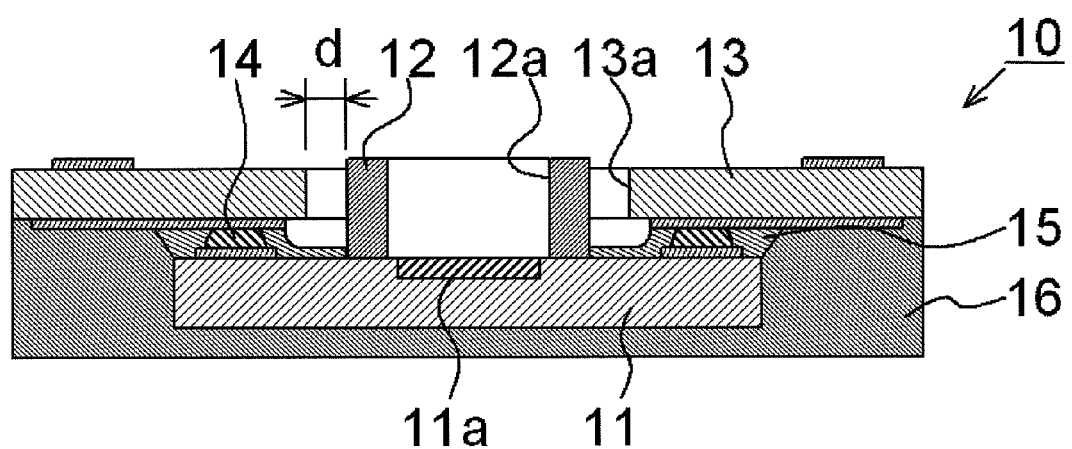
FIG. 2 is a cross sectional view along II-II line in FIG. 1.

An electronic device according to a first exemplary embodiment of the present invention will be explained. FIG. 1 is a perspective view of an electronic device according to a first exemplary embodiment of the present invention. FIG. 2 is a cross sectional view along II-II line in FIG. 1.

The electronic device 10 comprises a board 13, and an electronic element 11 mounted on the board 13 by a flip chip attachment. The electronic element 11 is connected with the board by an electrically conductive member (bump) 14. For example, an electric signal in the electronic element 11 is conveyed to the board 13 through the electrically conductive member 14 and then transferred to a terminal formed on the opposite surface to a surface facing to the electronic element 11 via an internal wiring of the board 13. The electrically conductive member 14 is coated with an underfill resin 15 and the underfill resin 15 acts so as to unite the board 13 and the electronic element 11.

The electronic element 11 comprises a functional portion 11a. The electronic element 11 may be, for example, a light receiving element for converting an optical signal into an electrical signal. In this case, the functional portion 11a is a light receiving portion.

The electronic device 10 further comprises a frame member or a pipe member 12 (referred to as "frame member" hereinafter) in which a first penetration hole 12a is perforated. The frame member 12 is provided on the electronic element 11 such that the first penetration hole 12a of the frame member 12 faces at least a part of the functional portion 11a and at least a part of the functional portion 11a is exposed through the first penetration hole 12a. Preferably, the frame member 12 is formed so as to surround the whole of the exposed part of the functional portion 11a.

The board 13 has a second penetration hole 13a at a position corresponding to the functional portion 11a of the electronic element 11. This means that the second penetration hole 13a faces at least a part of the functional portion 11a. The first penetration hole 12a of the frame member 12 and the second penetration hole 13a of the board 13 are also facing (opposing) each other. The board 13 does not contact with the frame member 12. Preferably, the electronic element 11 is mounted such that the frame member 12 is inserted in the second penetration hole 13a of the board 13. In this case a space d is formed between an outer surface of the frame member 12 and an internal surface of the second penetration hole 13a of the board 13. A distance of the space d is preferably formed such that the frame member 12 will not contact with the board 13 even when the frame member 12 and the board 13 expanded or elongated due to increasing of temperature. It is possible to prevent, owing to the arrangement, the board 13 from pressing the electronic element 11 locally via the frame member 12 even when the electronic element 11 is mounted on the board 13 or when the frame member 12 expanded by a heating step (heating step for mounting or a durability test such as a heating cycle test, etc. of an electronic device 10), for example. As a result, according to the present invention, it becomes possible to prevent breakage of the electronic element 11 by the frame member 12. Furthermore, upon temperature fluctuation, the frame member 12 can expand and contract independently from other elements having different linear expansion coefficients. As a result, according to the present invention, it becomes possible to prevent the frame member 12 from detaching from the electronic element 11 or exerting pressing force on the electronic element 11 even when the temperature fluctuated. In addition, a stress exerted on the electrically conductive member 14 can be reduced when the temperature fluctuated because expansion and contraction of the board 13 are not influenced by the frame member 12, or rather a freedom of degree of expansion and contraction can be improved by the space d. As a result, according to the present invention, it becomes possible to improve reliability of an electrical connection.

At least a part, preferably the whole, of the functional portion 11a of the electronic element 11 is exposed through the first penetration hole 12a of the frame member 12 and the second penetration hole 13a of the board 13. When the functional portion 11a is a light receiving portion, for example, an optical signal is input to the light receiving portion 11a through the first penetration hole 12a of the frame member 12.

Preferably, the height of the frame member 12 (height from a surface of the electronic element 11) is set such that the underfill resin 15 does not get over the frame member 12 into the first penetration hole 12a when the underfill resin 15 is filled. Preferably, a height of the frame member 12 is 0.03 mm or more (0.1 mm, for example) when the underfill resin 15 is an epoxy resin, for example. It may be possible to prevent the underfill resin 15 from getting over the frame member 12 onto the surface of the functional portion 11a unless oversupplying the underfill resin 15. Preferably, the height of the frame member 12 is set such that the frame member 12 does not project from the surface of the board 13 too much. For example, a height of the frame member 12 is preferably 1 mm or less. If the frame member 12 projects from the board 13 too high, the electronic device 10 becomes so thick.

A planar shape (outer circumferential shape) of an end surface of the frame member 12 is depicted as an annular shape (a planer shape of the first penetration hole 12a is circle) in FIG. 1; however, the shape is not limited to the shape but various shapes can be applied. For example, a planar shape of the end surface of the frame member 12 may be oval or polygonal. Also a shape of the first penetration hole 12a (inner circumferential shape) cannot be limited to a circle but can be various shapes such as an oval or polygon.

The frame member 12 may be formed by a resin, for example. When using a resin as a material of the frame member 12, the material of the frame member 12 may include photo-setting resin such as an acrylic resin or thermo-setting resin such as an epoxy resin. A kinetic viscoelasticity of the frame member 12 ranges preferably from 2 GPa to 6 GPa at 25 degrees C. in hardened state. In addition, the kinetic viscoelasticity of the frame member 12 ranges preferably at least 1 MPa, and 50 MPa or less at 200 degrees C. in hardened state. By virtue of the viscoelasticity of the frame member 12 of these ranges, the frame member 12 can deform elastically to some extent in accordance with the fluctuations of temperature and relieve the thermal stress during a reflow step for mounting the electronic device 10 or an environmental test, and the like. The viscoelasticity of the frame member 12 is measured in conformity with JISK7244-4.

The electronic device 10 further comprises a sealing resin 16. The sealing resin 16 seals a side of the board 13 on which the electronic element 11 is mounted so as to cover and protect the electronic element 11. An epoxy resin, for example, may be used as the sealing resin 16.

The electronic device 10 may further comprise a protection film (not shown) for protecting the functional portion 11a on the frame member 12 and the board 13. Preferably the protecting film shows a heat-resistance property at a temperature of reflow step or more and is made of a material that can be detached.

Next, a fabrication method of the electronic device according to a first exemplary embodiment of the present invention will be explained. A semiconductor device mounting a semiconductor element having a light receiving portion as a functional portion is employed as an example. FIGS. 3 and 4 are process flow diagrams illustrating fabrication steps of an electronic device according to a first exemplary embodiment of the present invention.

Figure 3A:
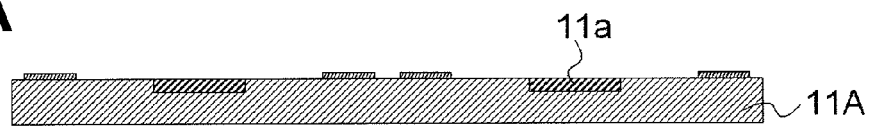
FIGS. 3A to 3F are process flow diagrams for illustrating fabrication manner of an electronic device according to a first exemplary embodiment of the present invention.

At first a wafer 11A, on which a plurality of semiconductor elements are formed as electronic elements, is prepared as shown in FIG. 3A. A light receiving portion 11a is exposed on a surface of each semiconductor element of the wafer 11A. Although two semiconductor elements are shown in FIG. 3A, the number of the semiconductor elements is not limited to two but may be one or 3 or more.

Figure 3B:

Next, a precursor film 12A for frame member is formed on the wafer 11A as shown in FIG. 3B. In a case where the frame member 12 is formed by a resin, a resin film or liquid resin may be used for the precursor film 12A for frame member. A resin film having a uniform thickness is more preferable. It will be easier to form a film made of resin having a thickness of uniform 0.03 mm or more on the whole wafer 11A by using a resin film than a liquid resin. When forming a frame member of a height of 0.1 mm, a precursor film 12A for frame member having a thickness of 0.1 mm will be used.

Figure 3C:
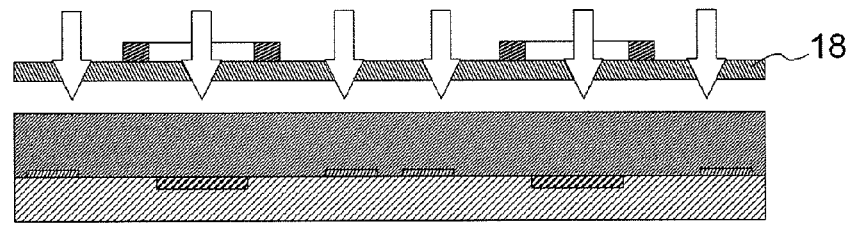
Figure 3D:
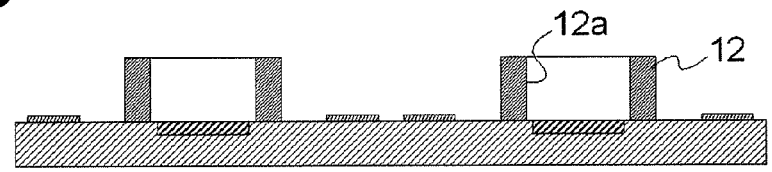

Next, the precursor film 12A for frame member is exposed and patterned using a mask 18 as shown in FIG. 3C. At this step the precursor film 12A for frame member is patterned such that the first penetration hole 12a of frame member 12 exposes at least a part, preferably the whole, of the light receiving portion 11a. Next, the precursor film 12A for frame member is developed and other parts (exposed parts) than a part that is to be a frame member 12 are removed. Then the precursor film 12A for frame member is formed into a shape of the frame member 12 to surround each of the light receiving portions 11a. Next, the precursor film 12A for frame member is heated to harden to form the frame member 12 (FIG. 3D) (the step shown by FIGS. 3B to 3D is referred to as frame member forming step). The heat processing produces secured union of the frame member 12 and the semiconductor element (wafer 11A). The frame member 12 won't be deformed so much by the heat processing.

According to the fabrication method, a plurality of frame members 12 of a plurality semiconductor elements 11 can be formed at one time and production efficiency can be increased.

Figure 3E:
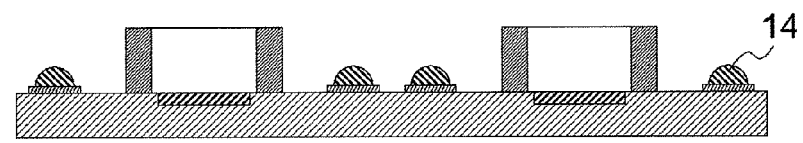

Next, an electrically conductive member 14, for attaching the wafer to the board 13 by flip chip, is formed on the wafer 11A (FIG. 3E). According to the present invention, the bump can be formed without taking the frame member 12 into account, that is, without requiring a high precision of height.

Figure 3F:
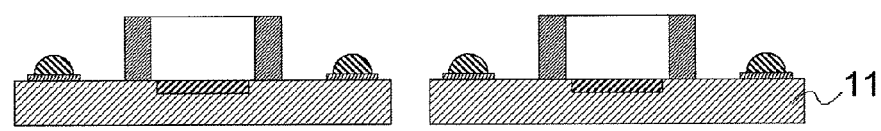

Next, the wafer 11A is cut into individual semiconductor element to form the semiconductor element 11 having a frame member 12 (FIG. 3F).

Figure 4A:
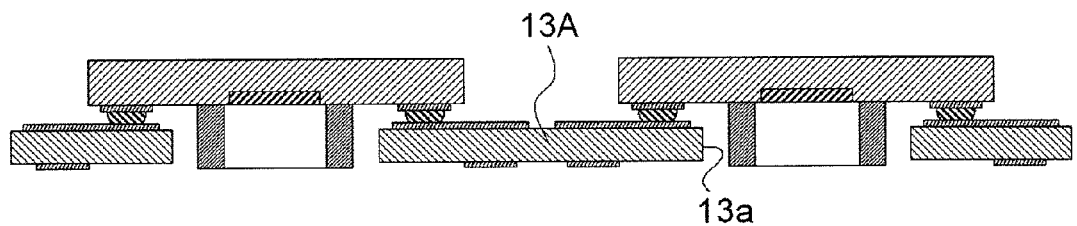
FIGS. 4A to 4D are process flow diagrams for illustrating fabrication manner of an electronic device according to a first exemplary embodiment of the present invention.

Next, a precursor material 13A for board containing a plurality of board 13 is prepared. A second penetration hole 13a is formed on each of the boards 13 of the precursor material 13A for board. Next, the semiconductor elements 11 are attached by flip chip on the precursor material 13A for board (FIG. 4A, referred to as mounting step). At this step, the semiconductor element 11 is attached such that the second penetration hole 13a of the board 13 faces both of the light receiving portion 11a and the first penetration hole 12a of the frame member 12 and such that the frame member 12 is inserted into the second penetration hole 13a.

According to the present invention, because the frame member 12 does not contact with the board 13, unnecessary stress toward the semiconductor element 11 from the frame member 12 in the mounting step can be prevented. A mounting efficiency is not decreased because a load control against the pressure from the frame 12 can be eliminated.

Figure 4B:
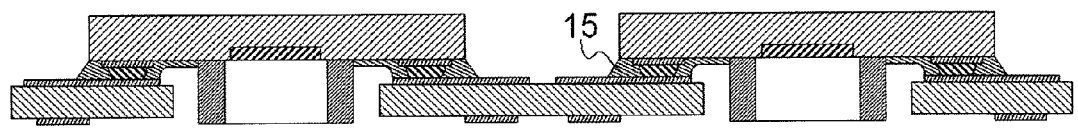

Next, an underfill resin 15 is formed around the electrically conductive member 14 for reinforcing the connection between the precursor material 13A for board and the semiconductor element 11 (FIG. 4B). When filling the underfill resin 15, spreading of the underfill resin 15 onto the light receiving portion 11a can be prevented by the frame member 12.

Figure 4C:
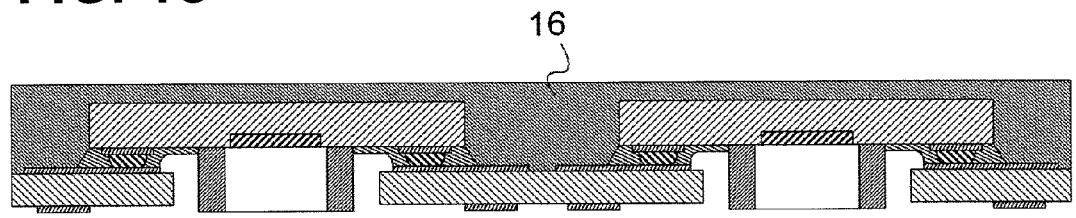
Figure 4D:
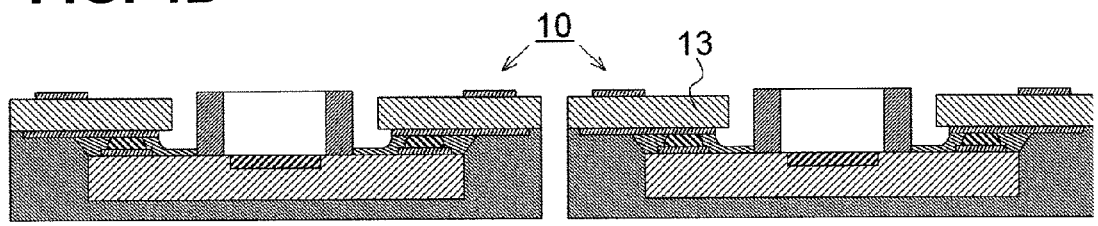

Next, a plurality of semiconductor elements 11 are sealed as a whole by a sealing resin 16 (FIG. 4C). The light receiving portion 11a is not covered by the sealing resin 16 because the underfill resin 15 is filled between the precursor material 13A for board and the semiconductor element 11 and the light receiving portion 11a is surrounded by the frame member 12.

Next, the precursor material 13A for board and the sealing resin are separated according to each semiconductor element 11 to produce the electronic device (semiconductor device) 10.

A protection film (not shown) for covering the frame member 12 and the board 13 may be formed as necessary.

Figure 5:
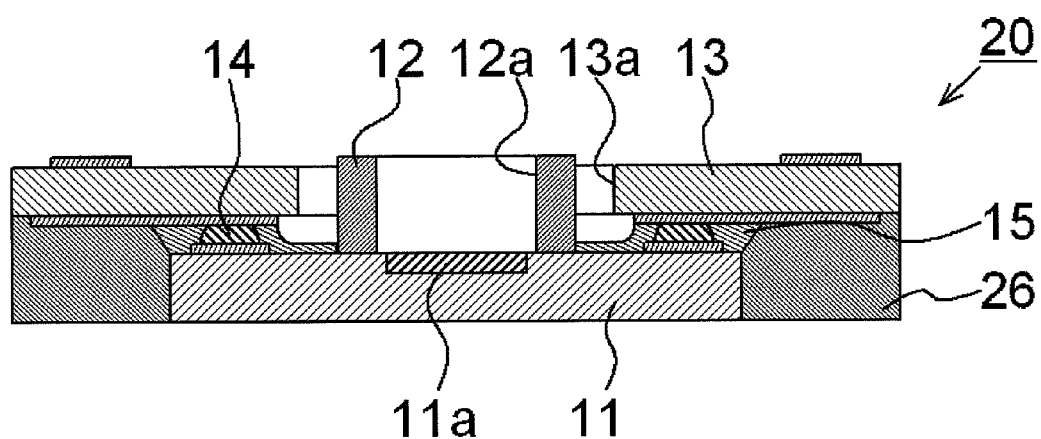
FIG. 5 is a cross sectional view of an electronic device according to a second exemplary embodiment of the present invention.

Next, an electronic device according to a second exemplary embodiment of the present invention will be explained. FIG. 5 is a cross sectional view of an electronic device according to a second exemplary embodiment of the present invention. In FIG. 5, the same element as a first exemplary embodiment is denoted by the same symbol.

A sealing resin 26 seals the whole of the electronic element 11 in the electronic device 10 of a first exemplary embodiment; however, a sealing resin 26 of an electronic device 20 of a second exemplary embodiment is formed such that a surface (referred to as "second surface" hereinafter) opposite to a surface (referred to as "first surface" hereinafter) on which the functional portion 11a of the electronic element 11 is formed is exposed. Other structures of the electronic device 20 of a second exemplary embodiment are the same as those of a first exemplary embodiment.

Figure 6:
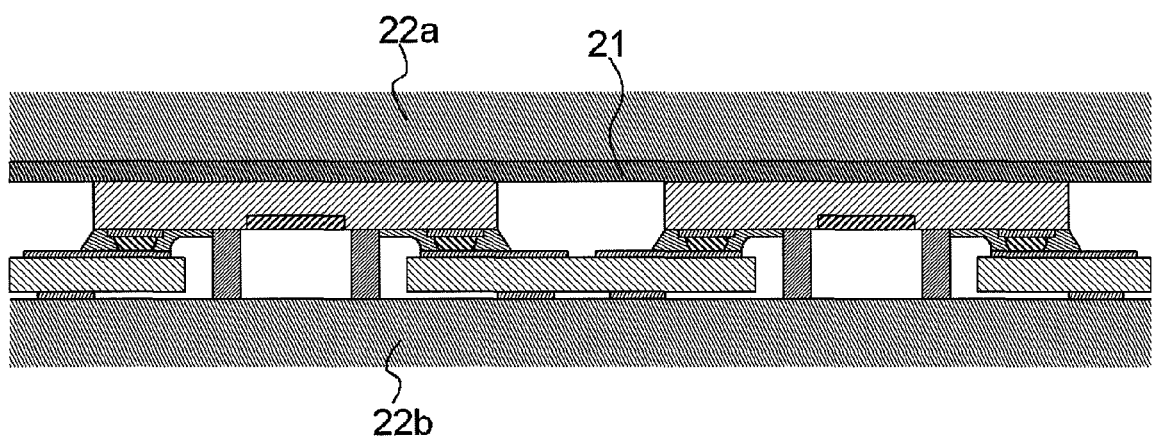
FIG. 6 is a process flow diagram for illustrating fabrication manner of an electronic device according to a second exemplary embodiment of the present invention.

Next, a fabrication method of the electronic device 20 of a second exemplary embodiment will be explained. FIG. 6 is a process flow diagram illustrating fabrication steps of the electronic device 20 of a second exemplary embodiment. A different step from the fabrication method of the electronic device 10 of a first exemplary embodiment, shown in FIGS. 3 and 4, is the resin sealing step shown in FIG. 4C. After the underfill resin forming step shown in FIG. 4B, a buffer sheet 21 is provided on the second surface of the electronic element 11 as shown in FIG. 6. Then a first sealing die 22a and a second sealing die 22b are set from upside and downside, respectively, and a sealing resin 26 is provided. The sealing resin 26 can be formed without covering the second surface of the electronic element 11 by such a fabrication method. The buffer sheet 21 is provided between the electronic element 11 and the sealing die 22 and prevents the sealing resin 26 from flowing into the second surface of the electronic element 11 and prevents the sealing die 22 from damaging the electronic element 11. A resin sheet having an extensibility and flexibility can be used as a buffer sheet 21 and a release film, for example, can be available.

Other fabrication steps of the electronic device 20 of a second exemplary embodiment are the same as those of a first exemplary embodiment.

According to a second exemplary embodiment, a heat radiation efficiency of the electronic element can be improved and therefore, a malfunction of the electronic device can be prevented.

Figure 7:
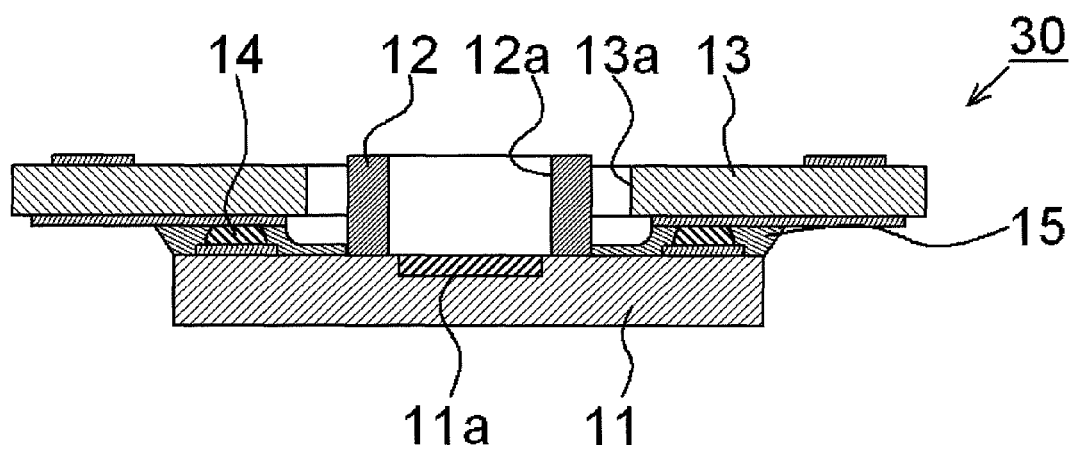
FIG. 7 is a cross sectional view of an electronic device according to a third exemplary embodiment of the present invention.

Next, an electronic device according to a third exemplary embodiment of the present invention will be explained. FIG. 7 is a cross sectional view of an electronic device of a third exemplary embodiment of the present invention. In FIG. 7, the same element as a first exemplary embodiment is denoted by the same symbol.

An electronic device 30 of a third exemplary embodiment, which is different from a first exemplary embodiment or a second exemplary embodiment, has no sealing resin. Other structures of the electronic device of a third exemplary embodiment are the same as those of a first exemplary embodiment.

A fabrication method of the electronic device 30 of a third exemplary embodiment is the same as that of a first exemplary embodiment except that the resin sealing step shown in FIG. 4C is eliminated.

According to a third exemplary embodiment, a heat radiation efficiency of the electronic device can be improved and therefore, a malfunction of the electronic device can be prevented.

Figure 8:
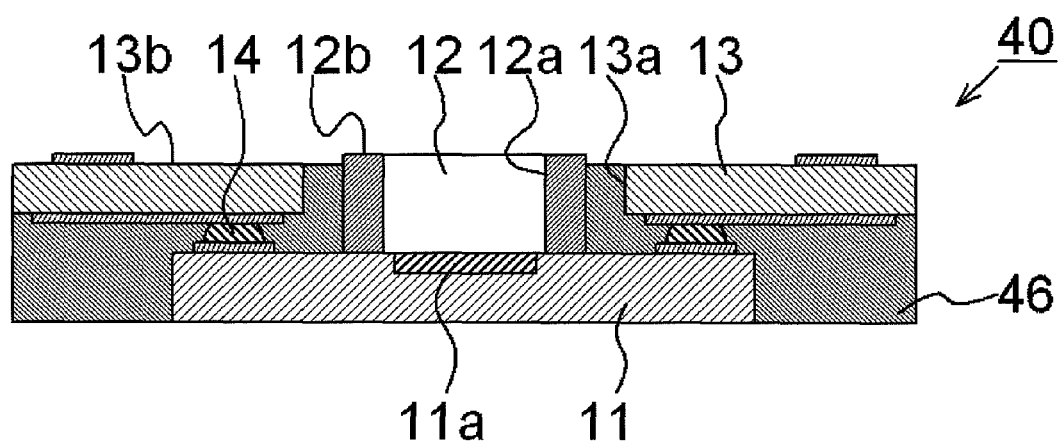
FIG. 8 is a cross sectional view of an electronic device according to a fourth exemplary embodiment of the present invention.

Next, an electronic device according to a fourth exemplary embodiment of the present invention will be explained. FIG. 8 is a cross sectional view of an electronic device of a fourth exemplary embodiment of the present invention. In FIG. 8, the same element as a first exemplary embodiment is denoted by the same symbol.

An electronic device 40 of a fourth exemplary embodiment, which is different from first to third exemplary embodiments, has no underfill resin. However, instead of that, a sealing resin 46 is filled between the electronic element 11 and the board 13, between the frame member 12 and the board 13 and around the electronic element 11.

Preferably, a top surface (end surface at a side of board 13) 12b of the frame member 12 protrudes from a top surface (exposed surface) 13b of the board 13. Preferably, the top surface 12b of the frame member 12 protrudes from the top surface 13b of the board 13 by 0.05 mm or more, for example. It is possible to prevent the sealing resin 46 from flowing into the first penetration hole 12a of the frame 12 during the resin sealing step by the protrusion of the top surface 12b of the frame member 12 from the top surface 13b of the board 13.

Other structures of the electronic element 40 of a fourth exemplary embodiment are the same as those of a first exemplary embodiment.

According to a fourth exemplary embodiment, the sealing resin 46 provided between the frame member 12 and the board 13 can relieve the stress due to an expansion or contraction of the elements caused by the fluctuations of temperature. As a result a reliability of the electronic device 40 can be improved.

Figure 9:
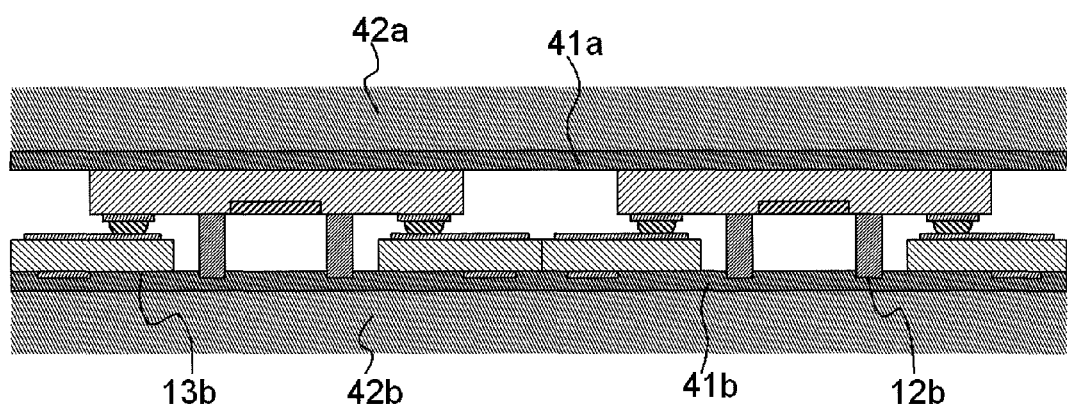
FIG. 9 is a process flow diagram for illustrating fabrication manner of an electronic device according to a fourth exemplary embodiment of the present invention.

Next, a fabrication method of the electronic device 40 of a fourth exemplary embodiment will be explained. The fabrication method of the electronic device 40 of a fourth exemplary embodiment does not include an underfill resin forming step shown in FIG. 4B. Instead of that, the sealing resin 46 is filled also between the electronic element 11 and the board 13 in the resin sealing step. FIG. 9 is a schematic sectional view for illustrating fabrication steps of the electronic device 40 of a fourth exemplary embodiment. As shown in FIG. 9, a first buffer sheet 41a is provided on the second surface of the electronic element 11 and a second buffer sheet 41b is provided on the upper surface (exposed surface) 13b of the board 13 after the mounting step shown in FIG. 4A. The first and the second buffer sheets 41a and 41b are similar to the buffer sheet of a second exemplary embodiment. Then a first and a second sealing dies 42a and 42b are set on the first and the second buffer sheets 41a and 41b at upper and lower layers, respectively, and the sealing resin 46 is formed. It is preferable to provide the second buffer sheet 41b such that the top surface 12b of the frame member 12 sinks into the second buffer sheet 41b or the second buffer sheet 41b is depressed by the top surface 12b of the frame member 12. The structure can prevent the sealing resin 46 from flowing into the first penetration hole 12a of the frame member 12. The flowing of the sealing resin 46 into the first penetration hole 12a can be also prevented by forming the frame members 12 in a uniform height. A local pressure exerted on the electronic element 11 by the die-forming may be diminished by an elastic deformation of the second buffer sheet 41b. The local pressure exerted on the electronic element 11 may be also reduced by an elastic deformation of the frame member 12 when the frame member 12 is made of resin.

A fabrication method of the electronic device 40 of a fourth exemplary embodiment other than the step above explained is the same as that of a first exemplary embodiment.

As many apparently widely different exemplary embodiments of the present invention can be made without departing from the spirit and scope thereof, it is to be understood that the invention is not limited to the specific exemplary embodiments thereof except as defined in the appended claims. Also it should be noted that any combination and/or selection of the disclosed and/or claimed elements, matters and/or items may fall under the modifications aforementioned.

It should be noted that other objects, features and aspects of the present invention will become apparent in the entire disclosure and that modifications may be done without departing the gist and scope of the present invention as disclosed herein and claimed as appended herewith.

The present invention can be applicable preferably to an electronic device having a light receiving portion as a functional portion, for example. Such an electronic device may be used for a DVD player, digital video camera or digital still camera, for example.

What is claimed is:

1. An electronic device comprising:
   an electronic element having an exposed functional portion on a first surface,
   a frame member having a first penetration hole, and
   a board having a second penetration hole, wherein;
   the frame member is provided on the first surface of the electronic element such that the first penetration hole faces at least a part of the functional portion,
   the electronic element is mounted on the board such that at least a part of the functional portion faces the second penetration hole, and
   the frame member does not contact with the board,
   wherein a gap is formed between an outer surface of the frame member and an internal surface of the second penetration hole of the board.

2. The electronic device according to claim 1, wherein the frame member is inserted into the second penetration hole of the board.

3. The electronic device according to claim 1, wherein the frame member has a height of 0.03 mm or more.

4. The electronic device according to claim 1, wherein the frame member is made of resin.

* * * * *